United States Patent [19]
Owaki

[11] 4,051,446
[45] Sept. 27, 1977

[54] TEMPERATURE COMPENSATING CIRCUIT FOR USE WITH A CRYSTAL OSCILLATOR

[75] Inventor: Masanao Owaki, Tokyo, Japan

[73] Assignee: Sony Corporation, Tokyo, Japan

[21] Appl. No.: 678,031

[22] Filed: Apr. 16, 1976

[30] Foreign Application Priority Data

Apr. 23, 1975  Japan ................. 50-49241

[51] Int. Cl.² .............. H03B 5/04; H03B 5/36
[52] U.S. Cl. ................. 331/116 R; 331/158; 331/176
[58] Field of Search ............ 331/66, 116 R, 158, 331/176; 307/229; 328/160

[56] References Cited

U.S. PATENT DOCUMENTS

| | | | |
|---|---|---|---|
| 3,454,903 | 7/1969 | Page | 331/176 X |
| 3,821,665 | 6/1974 | Irwin et al. | 331/176 X |
| 3,838,262 | 9/1974 | van de Plassche | 307/229 X |
| 3,956,643 | 5/1976 | Hite | 307/229 |

*Primary Examiner*—Siegfried H. Grimm
*Attorney, Agent, or Firm*—Lewis H. Eslinger; Alvin Sinderbrand

[57] ABSTRACT

A temperature compensating circuit for use with a crystal oscillator has a first bridge circuit for generating a first DC voltage with a linear functional temperature characteristic, a second bridge circuit for generating a second DC voltage with a quadratic functional temperature characteristic and a circuit for multiplying the first DC voltage and the second DC voltage so as to produce a DC voltage with a cubic functional characteristic. In this case, the DC voltage with the cubic functional characteristic is supplied to an oscillator circuit so as to compensate for variations in frequency of the crystal oscillator caused by temperature changes over a wide range thereof.

8 Claims, 8 Drawing Figures

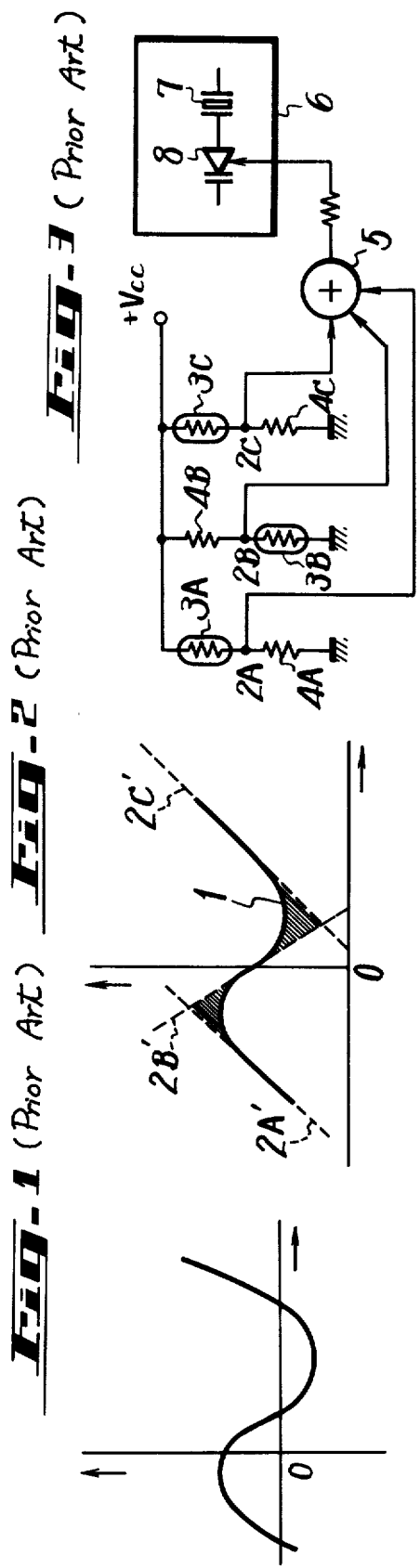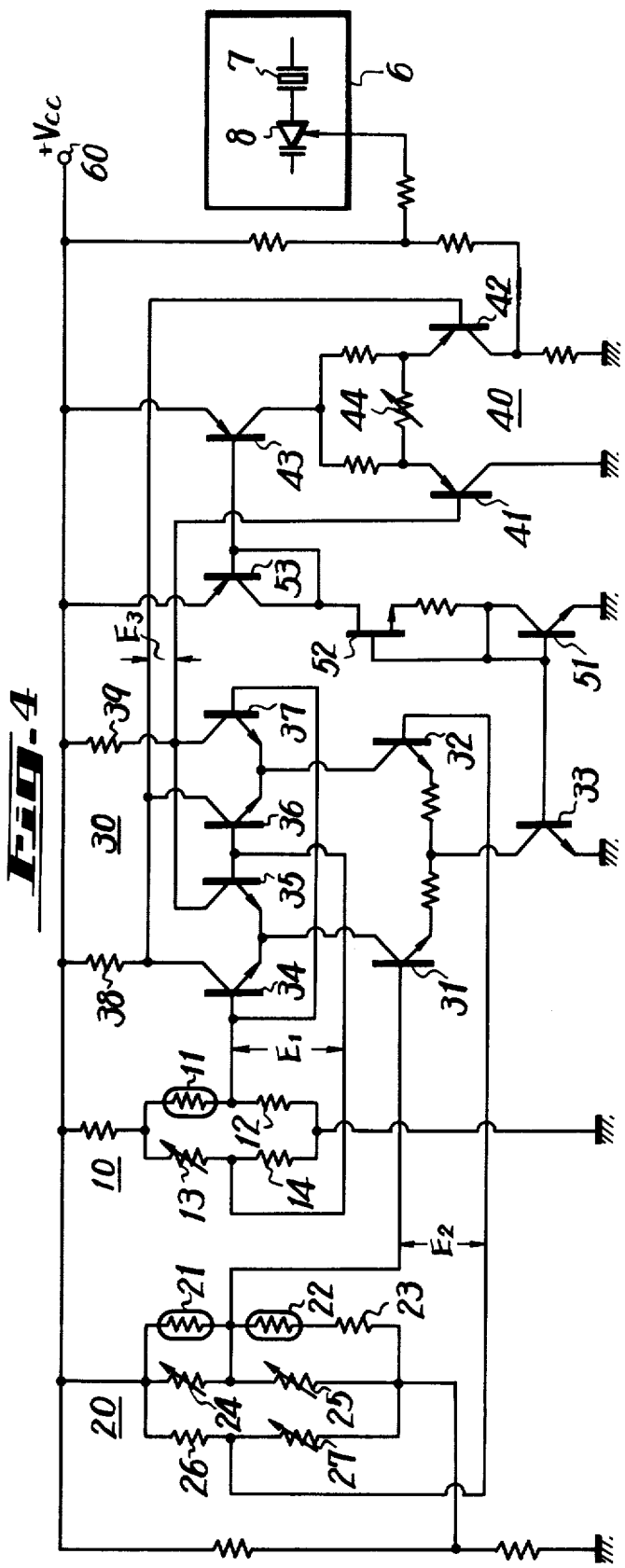

4,051,446

TEMPERATURE COMPENSATING CIRCUIT FOR USE WITH A CRYSTAL OSCILLATOR

BACKGROUND OF THE INVENTION

1. Field of the Invention

The present invention relates generally to a temperature compensating circuit for use with a crystal oscillator, and more particularly to a novel temperature compensating circuit for maintaining the frequency of a crystal oscillator substantially constant over a wide range of temperature variations 2. Description of the Prior Art In general, an oscillator circuit undergoes a variation or drift in the frequency thereof as a result of temperature variation. The variation in frequency of an oscillator circuit using an AT-cut quartz oscillator as a result of temperature variation is a cubic functional characteristic as shown in the graph of FIG. 1.

In order to eliminate such variation in frequency caused by temperature variation, a variable capacitance diode is connected in series to the quartz oscillator, a DC voltage 1 is produced whose level is varied in accordance with temperature variation as a cubic functional characteristic as shown in the graph of FIG. 2 by the solid line which is similar to the characteristic of FIG. 1, and the DC voltage 1 is supplied to the variable capacitance diode so as to compensate for variation in frequency due to temperature changes.

In the prior art, the circuit shown in FIG. 3 is employed for producing approximately the DC voltage 1 for compensation of the variation in frequency caused by temperature change. Such prior art temperature compensating circuit is shown to include a parallel connection consisting of a first series connection of a thermistor 3A and a resistor 4A, a second series connection of a resistor 4B and a thermistor 3B and a third series connection of a thermistor 3C and a resistor 4C, and an adding circuit 5. The parallel connection is supplied with a constant voltage $+V_{CC}$ at the sides of the thermistors 3A, 3C and the resistor 4B, respectively. Connection points 2A, 2B and 2C between the thermistors 3A to 3C and the resistors 4A to 4C of the respective series connections are connected to the adding circuit 5.

With the prior art circuit shown in FIG. 3, as shown in the graph of FIG. 2, a DC voltage 2A' with a positive temperature characteristic is obtained at the connection point 2A, a DC voltage 2B' with a negative temperature characteristic is obtained from the connection point 2B, and a DC voltage 2C' with a positive temperature characteristic is obtained from the connection point 2C.

The prior are circuit shown in FIG. 3 further has provided with an oscillation circuit 6 which includes a quartz oscillator 7 and a variable capacitance diode 8 connected in series thereto, and the above obtained DC voltages are supplied through the adding circuit 5 to the variable capacitance diode 8 for carrying out the temperature compensation.

With this prior art temperature compensating circuit, however, the DC voltages 2A' to 2C' only approximate the DC voltage 1 but do not coincide with the latter, so that errors are produced, for example, at the hatched portions in the graph of FIG. 2 and hence the temperature compensation is either excessive or insufficient.

SUMMARY OF THE INVENTION

The present invention has as its object to provide a temperature compensating circuit for use with a crystal oscillator which will produce a temperature compensation DC voltage having a cubic functional temperature characteristic.

It is a further object of the invention to provide a temperature compensating circuit for use with a crystal oscillator which has a predetermined temperature compensation characteristic.

It is still another object of the invention to provide a temperature compensating circuit for use with a crystal oscillator which is suitable for use with a quartz oscillator, and which compensates for variation in the oscillation frequency of the quartz oscillator sufficiently and with less error than existing compensating circuits.

It is a still further object of the invention to provide a temperature compensating circuit for use with a crystal oscillator which can be easily made as an integrated circuit.

According to an aspect of the present invention there is provided a temperature compensating circuit for use with a crystal oscillator which comprises an oscillation circuit, a first bridge circuit generating a first DC voltage having a linear functional temperature characteristic, a second bridge circuit generating a second DC voltage having a quadratic functional temperature characteristic, a circuit multiplying one of the first and second DC voltages by the other DC voltage so as to generate a third DC voltage having a cubic functional temperature characteristic, and a circuit applying the third DC voltage to the oscillation circuit for effecting temperature compensation of the latter.

The above, and other objects, features and advantages of the present invention, will become apparent from the following description taken in conjunction with the accompanying drawings.

BRIEF DESCRIPTION OF THE DRAWINGS

FIG. 1 is a graph showing a temperature variation or drift in the oscillation frequency of prior art quartz oscillator;

FIG. 2 is a graph showing a characteristic of a temperature compensating voltage obtained from a prior art temperature compensating circuit;

FIG. 3 is a connection diagram showing a prior art temperature compensating circuit;

FIG. 4 is a connection diagram showing a temperature compensating circuit for use with a crystal oscillator according to an embodiment of the present invention;

FIGS. 6A to 6C are graphs showing temperature variations or drifts in oscillation frequency of the quartz oscillator, in which FIG. 6A is the case where no temperature compensation is achieved, FIG. 6B is the case where suitably dimensional fixed resistors are used in the example of FIG. 4, and FIG. 6C is the case when some of the resistors in the example of FIG. 4 are adjusted.

DESCRIPTION OF THE PREFERRED EMBODIMENT

Figure 5:
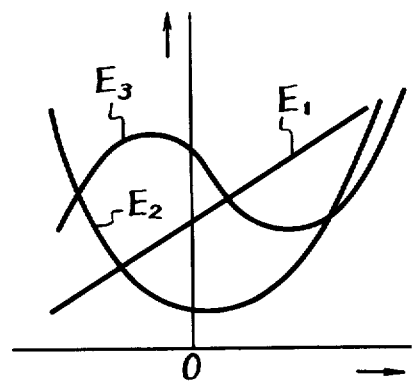
FIG. 5 is a graph showing a temperature characteristic of a temperature compensating voltage and to which reference will be made in explaining the operation of the temperature compensating circuit shown on FIG. 4.

An embodiment of a temperature compensating circuit for use with a crystal oscillator according to the present invention will be hereinafter described with reference to FIG. 4.

In FIG. 4, reference numeral 10 designates a first bridge circuit which will produce or generate a DC voltage whose level is varied as a linear functional characteristic in response to temperature variation. This bridge circuit 10 consists of a thermistor 11 and resistors 12, 13 and 14 which are connected to form a bridge as shown in the figure, and a constant DC voltage $+V_{CC}$ is applied across one pair of the diagonal connection points of the bridge circuit 10 from a power source terminal 60. A second bridge circuit 20, which will produce a DC voltage whose level is varied as in quardratic functional characteristic in response to the temperature variation, is formed of thermistors 21 and 22 and resistors 23, 24, 25, 26 and 27 which are connected to form a bridge, and the constant voltage $+V_{CC}$ is supplied from terminal 60 across one pair of the diagonal connection points of the bridge circuit 20.

In FIG. 4, reference numeral 30 designates a multiplying circuit which, by way of example is of a double balanced type and formed by differential amplifiers. More particularly, a first differential amplifier is formed of transistors 31 and 32 with a transistor 33 as a constant current source, a second differential amplifier amplifier is formed of transistors 34 and 35 with the transistors 31 as a constant current source, and a third differential amplifier is formed of transistors 36 and 37 with the transistor 32 as a constant current source. The other pair of the diagonal connection points of the first bridge circuit 10 are connected to the base electrodes of the transistors 34, and 37, respectively, and to the base electrodes of the transistors 35 and 36, respectively, and the other pair of the diagonal connection points of the second bridge circuit 20 are connected to the base electrodes of the transistors 31 and 32, respectively, in FIG. 4, reference numerals 38 and 39 indicate load resistors, respectively.

In place of the multiplying circuit, shown in FIG. 4, the following circuit which is well known can be used. In such alternative multiplying circuit the transistors 32, 36, 37 and the resistor 39 are omitted, and only the second differential amplifier formed of the transistors 34, 35 with the transistor 31 as the constant current source is used. In this case, the above mentioned other pair of the diagonal connection points of the first bridge circuit 10 are connected to the base electrodes of the transistors 34 and 35, and one of the other pair of the diagional points of the second bridge circuit 20 is connected to the base electrode of the transistor 31 while the other of such diagonal points is grounded. In this case, the remaining circuit construction is substantially the same as that shown in FIG. 4 and has the same effect.

In the embodiment of FIG. 4, there is provided a fourth differential amplifier 40 which is formed of transistors 41 and 42 with a transistor 43 as a constant current source. In this case, a resistor 44 is connected between the emitter electrodes of the transistors 41 and 42. Further, the collector electrodes of the transistors 34 and 36 and those of the transistors 35 and 37 are connected together to the base electrodes of the transistors 42 and 41, respectively, and the voltage obtained at the collector electrode of the transistor 42 is supplied to the variable capacitance diode 8 of the oscillator circuit 6 which is substantially the same as that of FIG. 3 and hence is marked with the same reference numeral. In FIG. 4, reference numerals 51, 53 and 52 denote transistors and an FET, respectively.

With the circuit of the invention shown in FIG. 4, a DC voltage $E_1$ (FIG. 5) whose level is varied in a linear functional characteristic in response to temperature variation is obtained from the first bridge circuit 10 and a DC voltage $E_2$, whose level is changed in a quadratic functional characteristic in response to the temperature variation is obtained from the second bridge circuit 20. Further, since these DC voltages $E_1$ and $E_2$ are supplied to the multiplying circuit 30 and then multiplied with each other thereby, the multiplying circuit 30 produces a DC voltage $E_3$ (FIG. 5) whose level is varied in a cubic functional characteristic in response to the temperature variation. The DC voltage $E_3$ is supplied through the fourth differential amplifier 40 to the variable capacitance diode 8 of the crystal oscillator 6 so as to compensate for the temperature drift in oscillation frequency.

In this case, the following relations exists between the resistance values of the resistors 27, 13, 44, 25, 24 and the DC voltage $E_3$.

| | |
|---|---|
| Resistance value of resistor 27→ | Linear functional component of DC voltage $E_3$ |
| Resistance value of resistor 13 | Quadratic functional component of DC voltage $E_3$ |
| Resistance value of resistor 44 | Cubic functional component of DC voltage $E_3$ |
| Resistance value of resistor 25 | Low-temperature component of DC voltage $E_3$ |
| Resistance value of resistor 24 | High temperature component of DC voltage $E_3$ |

Accordingly, it will be apparent that, if the resistance values of the resistors 27, 13, 44, 25 and 24 are changed, the respective voltage components of the DC voltage $E_3$ can be changed to sufficiently carry out the temperature compensation.

Figure 6A:
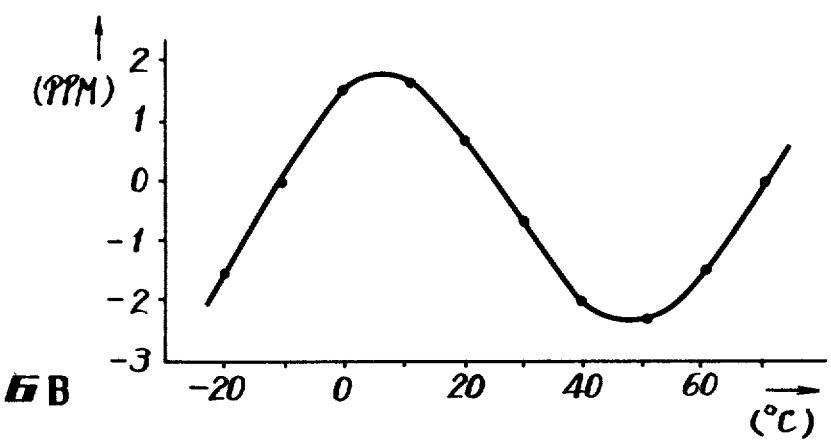
Figure 6B:
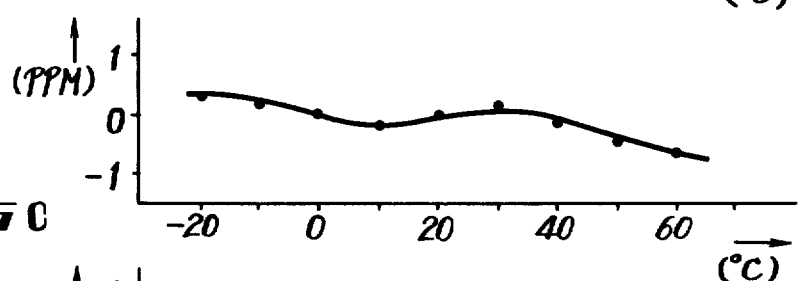
Figure 6C:
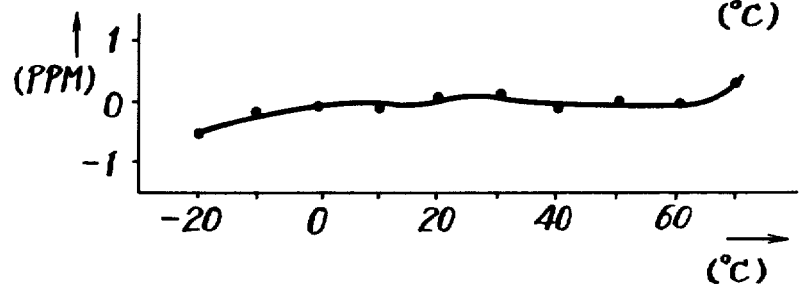

FIGS. 6A to 6C are graphs showing the results of measuring temperature induced drifts or variations in the oscillation frequency of the crystal oscillator. FIG. 6A illustrates the case where no temperature compensation is carried out, FIG. 6B illustrates the case where the resistors 27, 13, 44, 25 and 24 are of standard values and temperature compensation is carried out, and FIG. 6C illustrates the case where the resistance values of the resistors 13, 24, 25, 27 and 44 are adjusted and then the temperature compensated is carried out, respectively.

As may be apparent from the foregoing, the temperature induced drift or variation in oscillation frequency of the crystal oscillator can be greatly reduced or compensated for sufficiently by the temperature compensating circuit according to the invention for use with a crystal oscillator. Further, the error in compensation caused by the prior art circuit, as shown in FIG. 2 by the hatched portions, can be avoided. In addition, the circuit of the invention can be easily made as an integrated circuit.

Although a single preferred embodiment of the present invention it will be apparent that many modifications and variations could be effected therein by one skilled in the art without departing from the spirit or scope of the novel concepts of the invention, so that the scope of the invention should be determined by the appended claims.

I claim as my invention:

1. A temperature compensating circuit for use with a crystal oscillator, comprising:
   a. an oscillation circuit;
   b. a first bridge circuit for generating a first DC voltage having a linear functional temperature characteristic and including at least one temperature responsive variable resistance element;
   c. a second bridge circuit for generating a second DC voltage having a quadratic functional temperature characteristic and including at least two temperature responsive variable resistance elements;
   d. means for multiplying said first DC voltage by said second DC voltage so as to generate a third DC voltage having a cubic functional temperature characteristic; and
   e. means for applying said third DC voltage to said oscillation circuit.

2. A temperature compensating circuit for use with a crystal oscillator according to claim 1, wherein said first bridge circuit further includes three resistors, and said second bridge circuit further includes five resistors.

3. A temperature compensating circuit for use with a crystal oscillator according to claim 2, wherein at least one of said three resistors in said first bridge circuit and at least one of said five resistors in said second bridge circuit are variable resistors, respectively.

4. A temperature compensating circuit for use with a crystal oscillator according to claim 1, wherein said means for muliplying said first and second DC voltage includes at least two transistors each having first, second and third electrodes and connected to each other in a cascade, one of said two transistors being supplied with one of said first and second DC voltages at its first electrode, and another transistor connected with the other of said two transistors to form a differential amplifier, said differential amplifier being supplied with the other of said first and second DC voltages.

5. A temperature compensating circuit for use with a crystal oscillator according to claim 1, wherein said means for multiplying said first and second DC voltages is a multiplier including a transistor having first, second and third electrodes, and a differential amplifier, said first electrode of said transistor being supplied with said second DC voltage, and said differential amplifier being supplied with said first DC voltage.

6. A temperature compensating circuit for use with a crystal oscillator according to claim 1, wherein said means for multiplying said first and second DC voltages is a multiplier including first, second and third differential amplifiers of a double balanced type, said first differential amplifier being supplied with said second DC voltage, and said second and third differential amplifiers being supplied with said first DC voltage.

7. A temperature compensating circuit for use with a crystal osciIator according to claim 6, wherein said first differential amplifier includes first and second transistors each having first, second and third electrodes, a constant current supply source and a resistor, said third electrodes of said first and second transistors being connected through said resistor with each other and to said constant current supply source, each of said first electrodes of said first and second transistors being supplied with said second DC voltage; said second differential amplifier includes third and fourth transistors each having first, second and third electrodes, said third electrodes of said third and fourth transistors being connected to each other and to said second electrode of said first transistor; and said third differential amplifier includes fifth and sixth transistors each having first, second and third electrodes, said third electrodes of said fifth and sixth transistors being connected to each other and to said second electrode of said second transistor, each of said first electrodes of said third to sixth transistors being supplied with said first DC voltage, each of said second electrodes of said first and fifth transistors being connected to a first output terminal, and each of said second electrodes of said fourth and sixth transistors being connected to a second output terminal.

8. A temperature compensating circuit for use with a crystal oscillator according to claim 1, wherein said first bridge circuit comprises a first series circuit consisting of a first thermistor and a first resistor connected through a first connecting point, and a second series circuit consisting of a first variable resistor and a second resistor connected through a second connecting point, and said second bridge circuit comprises a third series circuit consisting of second and third thermistors and a third resistor connected through a third connecting point, a fourth series circuit consisting of second and third variable resistors connected through a fourth connecting point which is connected to said third connecting point, and a fifth series circuit consisting of a fourth resistor and a fourth variable resistor connected through a fifth connecting point, and in which said first DC voltage is produced between said first and second connecting points and said second DC voltage is produced between said third and fourth connecting points.

* * * * *